United States Patent
Kang et al.

(10) Patent No.: US 8,360,304 B2
(45) Date of Patent: Jan. 29, 2013

(54) METHOD OF OPERATING A CLAMPING SYSTEM OF A WIRE BONDING MACHINE

(75) Inventors: Sung Sig Kang, Singapore (SG); Hing Kuong Wong, Singapore (SG); Samuel Capistrano, III, Singapore (SG); Abdul Shukor Mohd Salleh, Singapore (SG); Wun Man Oranna Yauw, Singapore (SG)

(73) Assignee: Kulicke and Soffa Industries Inc., Fort Washington, PA (US)

( * ) Notice: Subject to any disclaimer, the term of this patent is extended or adjusted under 35 U.S.C. 154(b) by 0 days.

(21) Appl. No.: 13/381,140

(22) PCT Filed: Jul. 19, 2010

(86) PCT No.: PCT/US2010/042382
§ 371 (c)(1),
(2), (4) Date: Jan. 3, 2012

(87) PCT Pub. No.: WO2011/011298
PCT Pub. Date: Jan. 27, 2011

(65) Prior Publication Data
US 2012/0104075 A1    May 3, 2012

Related U.S. Application Data

(60) Provisional application No. 61/226,921, filed on Jul. 20, 2009.

(51) Int. Cl.
*B23K 31/00* (2006.01)
*B23K 5/22* (2006.01)

(52) U.S. Cl. .................. 228/180.5; 228/212; 228/213

(58) Field of Classification Search ............... 228/180.5, 228/4.5, 212, 213, 44.7
See application file for complete search history.

(56) References Cited

U.S. PATENT DOCUMENTS

| | | | |
|---|---|---|---|
| 5,181,646 A * | 1/1993 | Ushiki et al. | 228/4.5 |
| 5,297,722 A | 3/1994 | Takahashi et al. | |
| 5,796,161 A * | 8/1998 | Moon | 257/676 |
| 6,645,346 B2 * | 11/2003 | Mii et al. | 156/583.1 |
| 7,578,425 B2 * | 8/2009 | Kampschreur et al. | 228/180.5 |
| 8,016,183 B2 * | 9/2011 | Wong et al. | 228/180.5 |
| 2002/0105130 A1 | 8/2002 | Mii et al. | |

FOREIGN PATENT DOCUMENTS

| | | |
|---|---|---|
| JP | 06-326149 | 11/1994 |
| JP | 10-084031 | 3/1998 |
| KR | 10-2004-0042919 | 5/2004 |
| KR | 10-0779027 | 11/2007 |

OTHER PUBLICATIONS

International Search Report dated Jan. 25, 2011, International Application No. PCT/US2010/042382.

* cited by examiner

*Primary Examiner* — Kiley Stoner
*Assistant Examiner* — Carlos Gamino

(57) ABSTRACT

A method of operating a wire bonding machine is provided. The method includes the steps of: (1) providing a workpiece secured in a bonding position by a device clamp of a wire bonding machine; (2) raising the device clamp to a first height above the workpiece, the device clamp remaining at the first height for a first predetermined period of time; and (3) raising the device clamp to a second height above the workpiece after step (2), the second height being further away from the workpiece than the first height.

28 Claims, 15 Drawing Sheets

```
A: START WITH HEAT BLOCK AND DEVICE CLAMP CLOSED
                        ↓
B: HEAT BLOCK LOWERED BY X MIL TO INITIAL OPEN POSITION
                        ↓
C: TIME DELAY $T_1$ MSEC
                        ↓
D: HEAT BLOCK LOWERED TO FULL OPEN POSITION
                        ↓
E: TIME DELAY $T_2$ MSEC
                        ↓
F: DEVICE CLAMP RAISED TO FULL OPEN POSITION
                        ↓
                       END
```

FIG. 13

METHOD OF OPERATING A CLAMPING SYSTEM OF A WIRE BONDING MACHINE

CROSS-REFERENCE TO RELATED APPLICATION

This application claims the benefit International PCT Application No. PCT/US2010/042382 filed Jul. 19, 2010 which claims the benefit of U.S. Provisional Application No. 61/226,921, filed Jul. 20, 2009, the contents of both of which are incorporated herein by reference.

FIELD OF THE INVENTION

The present invention relates to wire bonding machines, and more particularly, to improved methods of operating clamping systems on wire bonding machines.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding machine includes an indexing system for moving a workpiece (e.g., a semiconductor die/dice on a leadframe) between a supply location (e.g., a magazine handler) and a bonding location using grippers or the like. Exemplary indexing systems include rails or the like along which the workpiece is moved during indexing. When the workpiece reaches the bonding location a support surface such as a heat block is raised to meet the lower side of the workpiece. A device clamp (also known as a clamp insert or a window clamp) is lowered to secure the workpiece from above. The device clamp defines an aperture(s) through which a wire bonding operation is completed. FIG. 1A illustrates workpiece 100 which was moved along rails 102. In this wire bonding position heat block 104 has been raised to meet the lower surface of workpiece 100. Device clamp 106 has been lowered to secure workpiece 100 against heat block 104. In this closed position (i.e., with heat block 104 in the raised position and device clamp 106 in the lowered position) wire loops 100a are formed in a wire bonding operation.

After a wire bonding operation is complete (or a portion of the wire bonding operation is complete) the workpiece is moved. For example, the wire bonding of the entire workpiece may be complete and the workpiece is to be moved to a post bonding location. Alternatively, the wire bonding of a portion of the workpiece may be complete, but another portion of the workpiece still needs to be wire bonded. In order to wire bond the other portion of the workpiece, the workpiece is moved.

In either of these two cases, in order to move the workpiece (e.g., along the rails) the device clamp is raised to an open location and the heat block is lowered to an open position. Referring now to FIG. 1B, device clamp 106 has been raised to the open position and heat block 104 has been lowered to the open position. These open positions are predetermined to allow sufficient clearance for the workpiece (including the wire loops bonded to the workpiece) to be moved along the rails.

Unfortunately, when device clamp 106 and heat block 104 are moved to the predetermined open positions shown in FIG. 1B certain problems may result. For example, because of the non-uniform heat expansion of workpiece 100 (e.g., lead-frame 100), workpiece 100 may buckle (where such buckling is labeled as "BUCK" in FIG. 1B) causing undesirable vibration (where such vibration is labeled as "VIB" in FIG. 1B). Further, the uncontrolled buckling of workpiece 100 may also cause contact (where such contact is labeled as "CONT" in FIG. 1B) between the wire loops 100a on workpiece 100 and device clamp 106, for example, during indexing.

Thus, it would be desirable to provide improved methods of operating clamping systems for wire bonding machines.

SUMMARY OF THE INVENTION

According to an exemplary embodiment of the present invention, a method of operating a wire bonding machine is provided. The method includes the steps of: (1) providing a workpiece secured in a bonding position by a device clamp of a wire bonding machine; (2) raising the device clamp to a first height above the workpiece, the device clamp remaining at the first height for a first predetermined period of time; and (3) raising the device clamp to a second height above the workpiece after step (2), the second height being further away from the workpiece than the first height.

According to another exemplary embodiment of the present invention, a method of operating a wire bonding machine is provided. The method includes the steps of: (1) providing a workpiece supported in a bonding position by a heat block of a wire bonding machine; (2) lowering the heat block to a first position below the workpiece, the heat block remaining at the first position for a first predetermined period of time; and (3) lowering the heat block to a second position below the workpiece after step (2), the second position being further away from the workpiece than the first position.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 5-19 are flow diagrams illustrating various methods of operating a wire bonding machine in accordance with various exemplary embodiments of the present invention.

DETAILED DESCRIPTION OF THE INVENTION

According to certain exemplary embodiments of the present invention, methods of operating a wire bonding machine, and more specifically the clamping system of the wire bonding machine, are provided. In the bonding position, the clamping system of the wire bonding machine may include a heat block for supporting the workpiece during a wire bonding operation (i.e., during the formation of wire loops and/or conductive bumps), and a device clamp for securing the workpiece to the heat block during the wire bonding operation. If the bonding operation for the workpiece (or a portion of the workpiece) is complete, the clamping system may be relaxed (e.g., the device clamp is to be raised and/or the heat block is to be lowered). However, unlike conventional techniques, at least one of the device clamp and the heat block is relaxed to a first position/height for a predetermined period of time. Then, the at least one of the device clamp and the heat block is relaxed to a second position/height. Thus, because the operation (e.g., raising the device clamp and/or lowering the heat block) has been accomplished in multiple steps, the workpiece (e.g., a leadframe strip) does not tend to warp and therefore does not suffer from the above-mentioned deficiencies of conventional techniques. More specifically, the workpiece is given some time to settle (e.g., cool down, etc.) before moving the clamping element(s) to a full open position for indexing.

The elements of the clamping system (e.g., the device clamp and heat block) may be operated together or separately in any of a number of techniques (examples of which are illustrated in FIGS. 5-19).

The clamping elements used in connection with the present invention (e.g., device clamp, heat block, etc.) may be programmed (e.g., using software of the wire bonding machine, software networked with the wire bonding machine, etc.) such that the element(s) have an initial/partial open state as well as a full open state. By adding an initial/partial open state for at least one of the clamping elements, workpiece/leadframe distortion (e.g., bending, warping, etc.) may be controlled and minimized during the unclamp motion (i.e., during relaxation of at least one of the clamping elements). Additionally, associated vibration of the workpiece/leadframe is also reduced. The timing, order, and amount (e.g., amount of motion such as amount that the device clamp is raised, amount the heat block is lowered, etc.) for the initial/partial open state is programmable. As will be appreciated by those skilled in the art, by reducing the distortion of the workpiece (e.g., a leadframe strip), the damage to wire loops formed on the workpiece is also reduced.

Figure 1A:
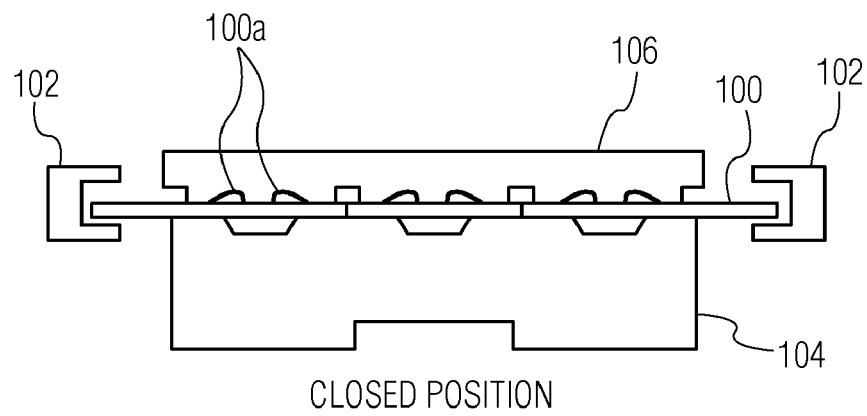
FIG. 1A is a block diagram side view of a workpiece secured in place by a heat block and a device clamp.
Figure 1B:
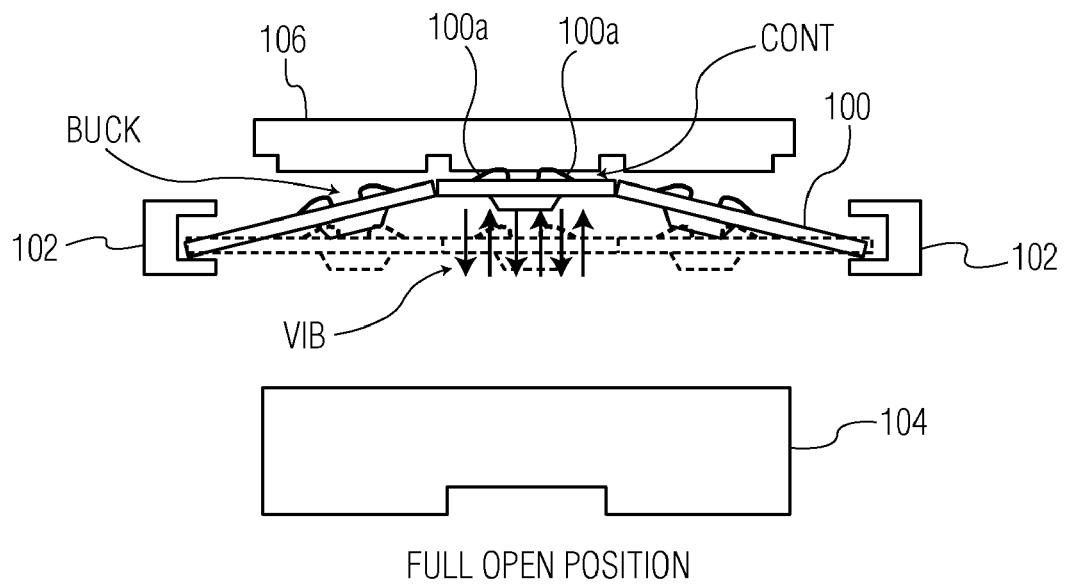
FIG. 1B is a block diagram side view of the workpiece of FIG. 1A with the heat block and the device clamp in a full open position.
Figure 2A:
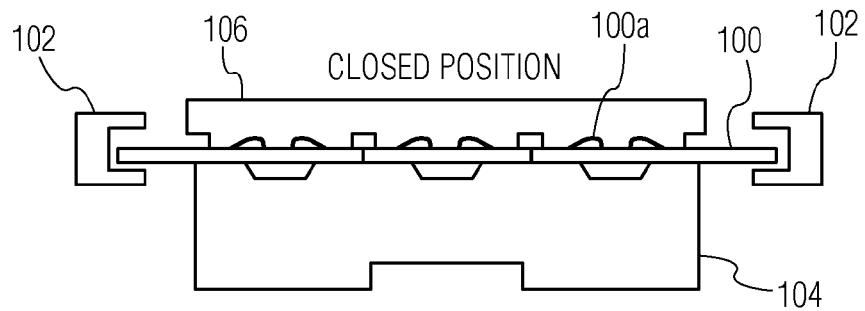
FIG. 2A is a block diagram side view of a workpiece secured in place by a heat block and a device clamp useful in explaining various exemplary embodiments of the present invention.
Figure 2B:
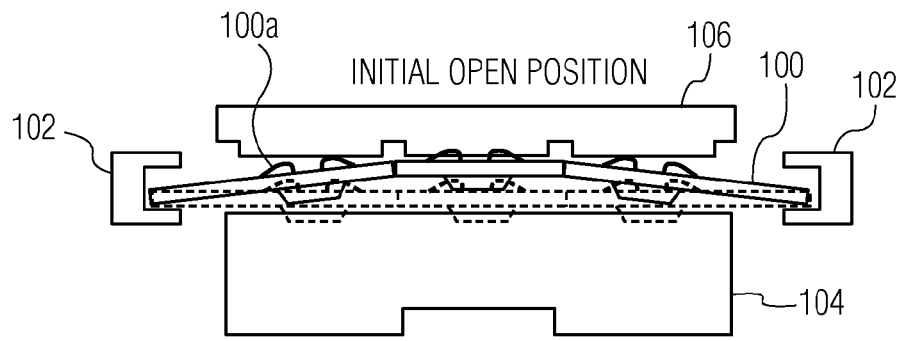
FIG. 2B is a block diagram side view of the workpiece of FIG. 2A with the heat block and the device clamp in an partially open position in accordance with an exemplary embodiment of the present invention.

Referring now to FIG. 2A, workpiece 100 (e.g., leadframe 100) is shown with reference numerals identical to those shown in FIG. 1A. In FIG. 2B, device clamp 106 has been raised to an initial open position (not to a full open position used for indexing). Likewise, heat block 104 has been lowered to an initial open position (not to a full open position used for indexing). Device clamp 106 and heat block 104 remain at their respective initial open heights/positions for a predetermined period of time, allowing for workpiece 100 to cool down or otherwise reach a relatively settled state. Then, at FIG. 2C, both heat block 104 and device clamp 106 are moved to their respective full open positions. By inserting an initial open position into the clamping elements motion sequence (e.g., the motion sequence of device clamp 106 and heat block 104), vibration and associated warping/bending/buckling of workpiece 100 is substantially reduced. Now at the position shown in FIG. 2C, with adequate clearance (where such clearance between the device clamp 106 and wire loops 100a is labeled as "CLR" in FIG. 2C), workpiece 100 may be indexed as is desired. For example, if all wire bonding of workpiece 100 is completed, it may be indexed to another location (e.g., a post bond station, an eject magazine, etc.). If another portion of workpiece 100 is still to be wire bonded, then workpiece 100 is indexed to the desired position so that clamping elements 104, 106 can then be moved into their respective positions so that workpiece 100 is secure and ready for additional bonding.

Figure 2C:
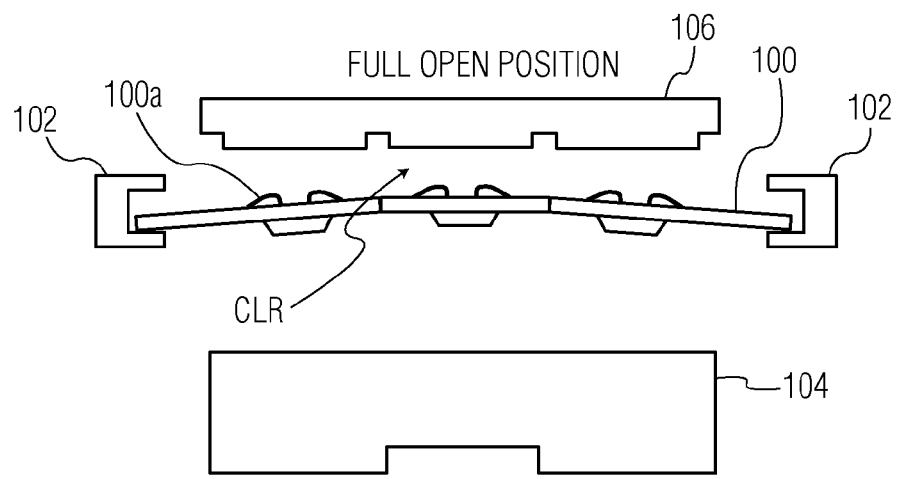
FIG. 2C is a block diagram side view of the workpiece of FIG. 2A with the heat block and the device clamp in a full open position in accordance with an exemplary embodiment of the present invention.

Of course, the sequence illustrated and described with respect to FIGS. 2A-2C is exemplary in nature. That is, this example shows both clamping elements being used in an initial open state, and then in the full open state. Further, the clamping elements are operated concurrently. That is, in FIG. 2B, both heat block 104 and device clamp 106 have been opened to their respective initial open positions concurrently. As will be clear from the various examples shown in FIGS. 5-19, only one of the elements may be operated in an initial open state/position/height. Additionally, the elements may be operated separately, in various different orders and timing sequences.

Figure 3:
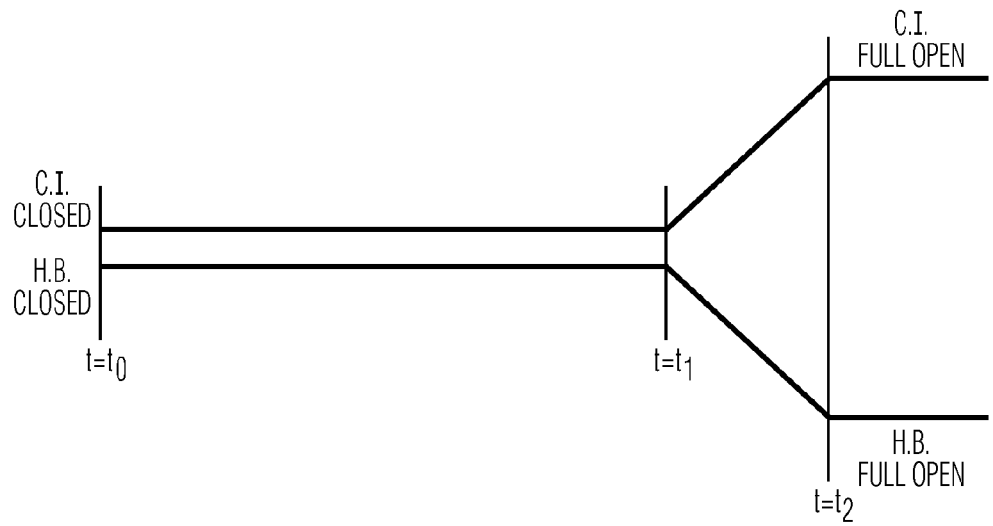
FIG. 3 is a timing diagram illustrating the status of a device clamp and a heat block in a conventional operation.

Referring now to FIG. 3, a timing diagram is provided which illustrates the status of a device clamp and a heat block of a conventional wire bonding machine technique. At time $t_0$, both the heat block and the device clamp are in a closed position. At time $t_1$, the motion of both elements toward a full open position begins (i.e., the heat block starts to lower below the workpiece and the device clamp starts to raise above the workpiece). At time $t_2$, both elements have reached their full open position (i.e., the heat block has reached its full open position and the device clamp has reached its full open position). Now the workpiece can be indexed along the material handling system of the wire bonding machine as desired.

Figure 4:
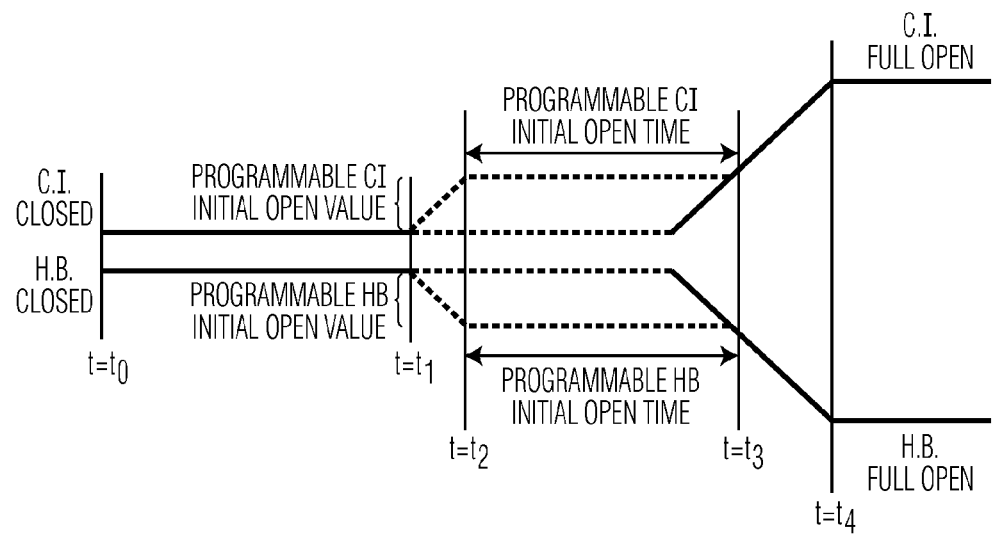
FIG. 4 is a timing diagram illustrating the status of a device clamp and a heat block in accordance with an exemplary embodiment of the present invention.

FIG. 4 is a timing diagram according to an exemplary embodiment of the present invention. At time $t_0$, both the heat block and the device clamp are in a closed position. At time $t_1$, the motion of both elements toward an initial open position begins (i.e., the heat block starts to lower below the workpiece and the device clamp starts to raise above the workpiece). At time $t_2$, both elements have reached their initial open position (i.e., the heat block has reached its initial open position and the device clamp has reached its initial open position). The time between $t_2$ and $t_3$ is the time that the elements remain in their respective initial open positions (as indicated in FIG. 4, this time is programmable). At time $t_3$, both elements begin to move toward their full open positions. At time $t_4$, both elements have reached their full open position (i.e., the heat block has reached its full open position and the device clamp has reached its full open position). Now the workpiece can be indexed along the material handling system of the wire bonding machine as desired. Of course, this diagram is illustrative in nature and only illustrates certain exemplary embodiments of the invention where both elements have initial positions and final positions, and where the elements are moved concurrently. However, the invention is not limited to such embodiments.

Figure 5:
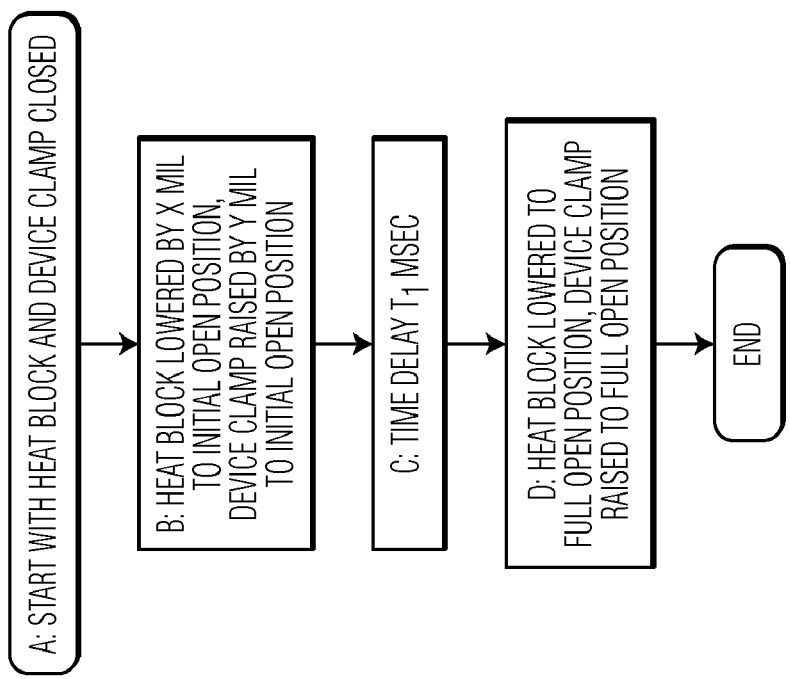

FIGS. 5-19 are flow diagrams illustrating various different methods of operating a wire bonding machine in accordance with the present invention. Referring to FIG. 5, at step A both elements are in the closed position. At step B, both elements are moved to their initial open position (e.g., both elements are moved in a range between 0-100 mils, for example, 10-15 mils). At step C, a predetermined time delay passes while the elements are in their initial open position (e.g., an exemplary time delay may be between 0-10,000 milliseconds, for example, between 500-800 milliseconds). At step D, both elements are moved to their full open position. At step D, the process is complete, and the workpiece may be indexed.

Figure 6:
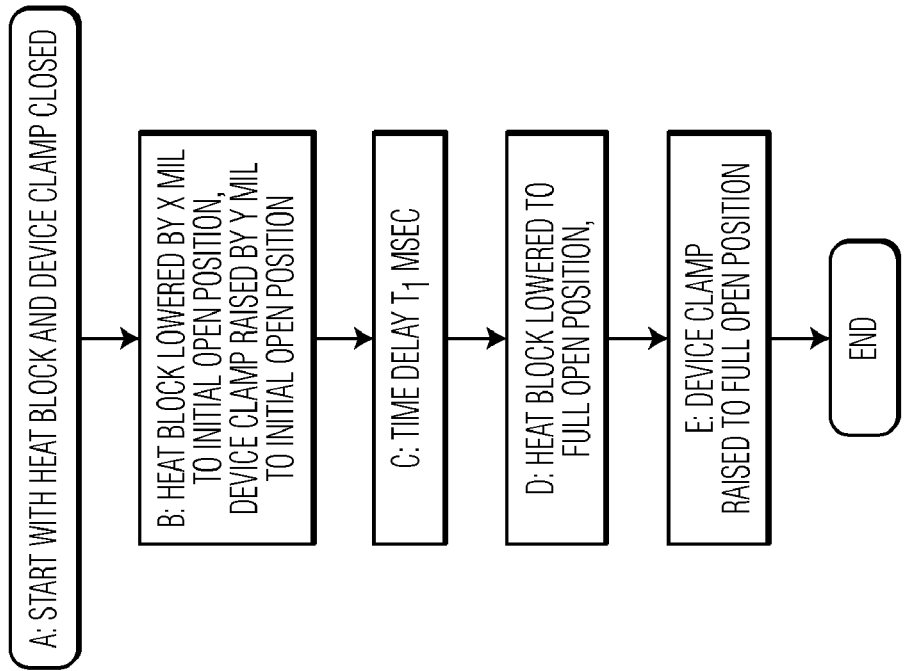
Figure 7:
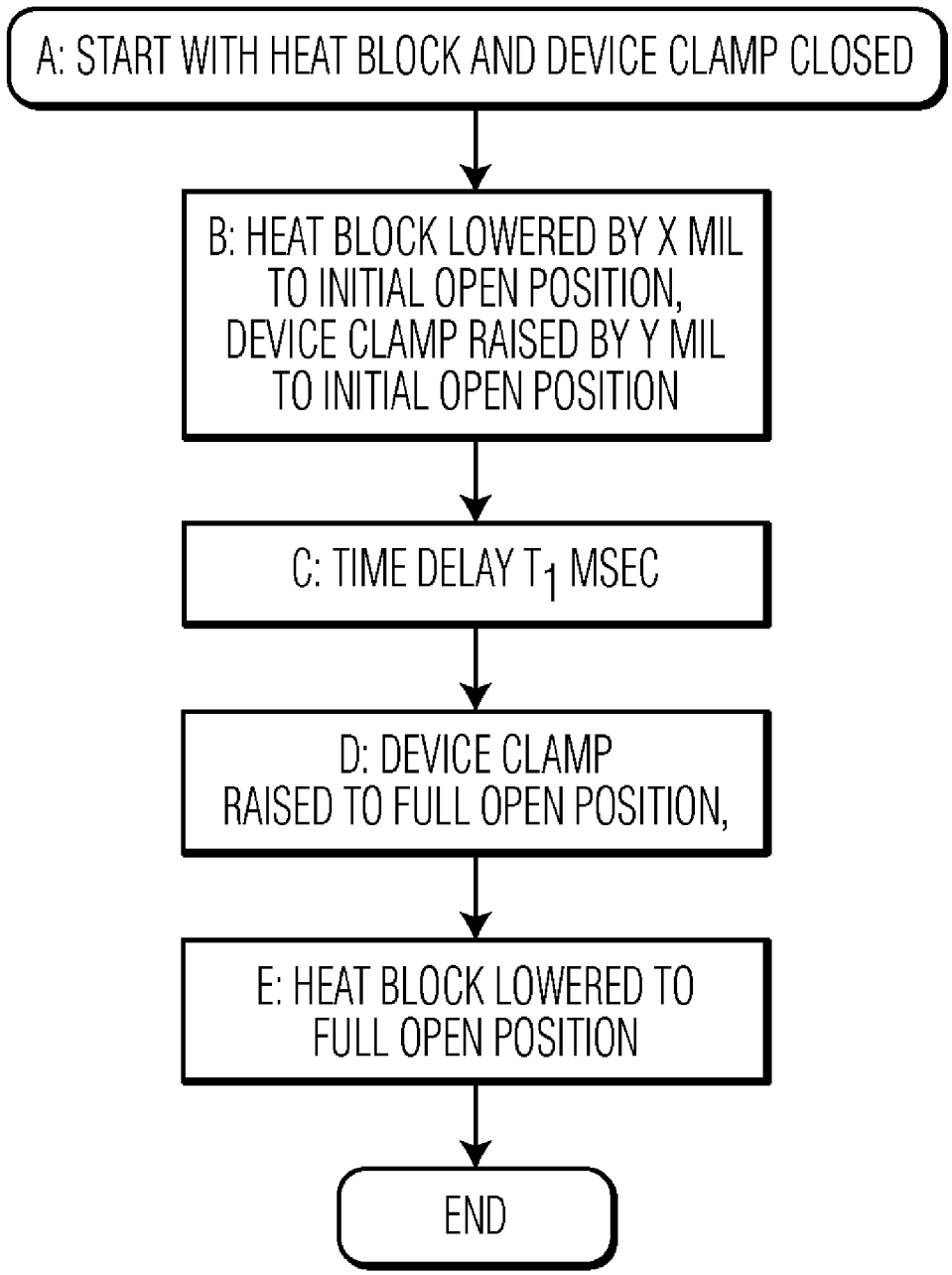
Figure 9:
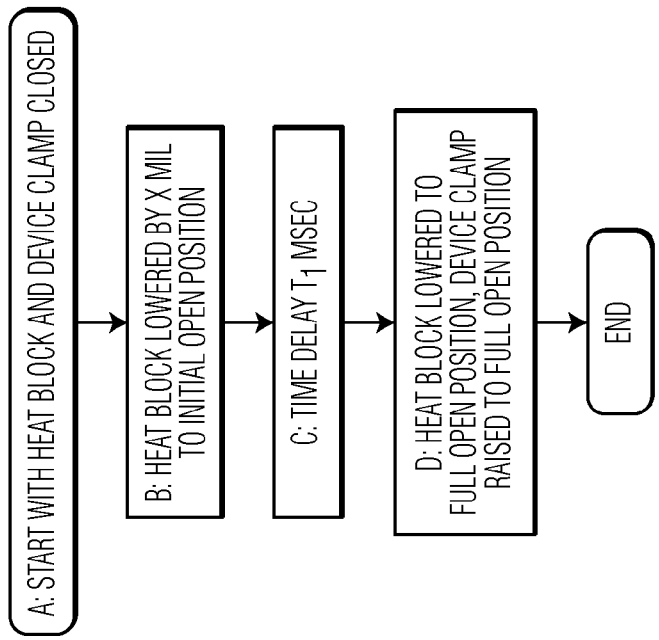
Figure 8:
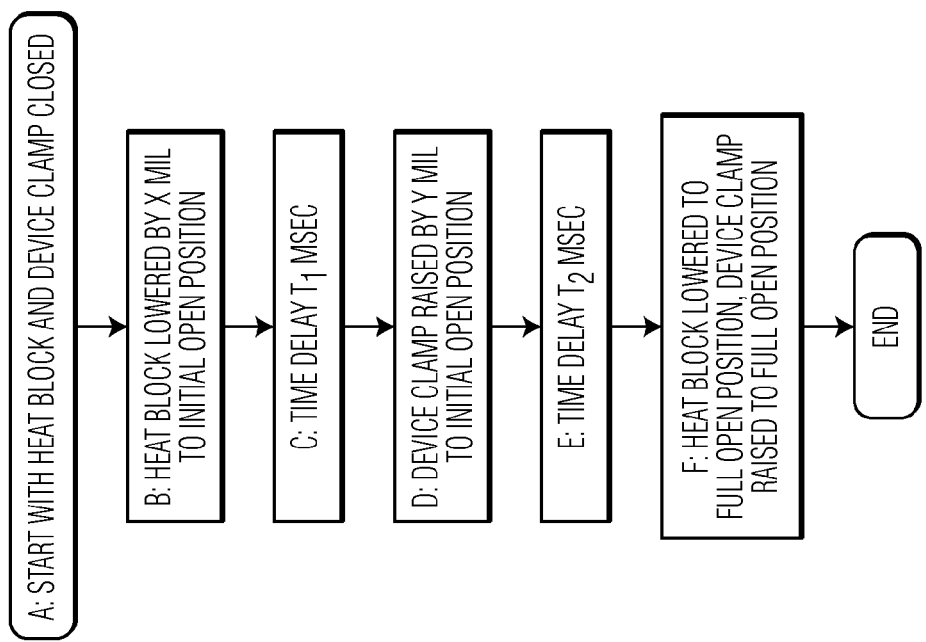
Figure 10:
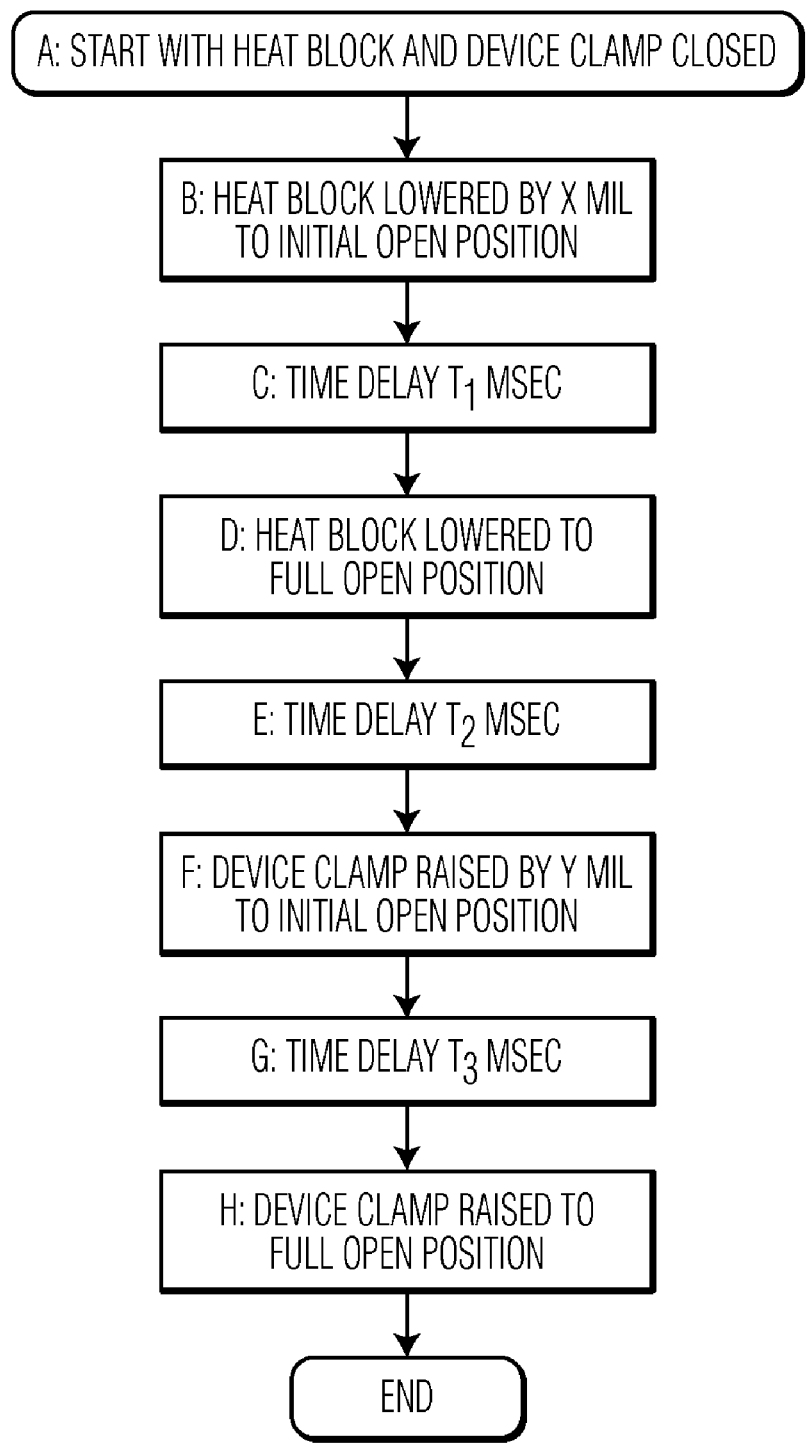
Figure 11:
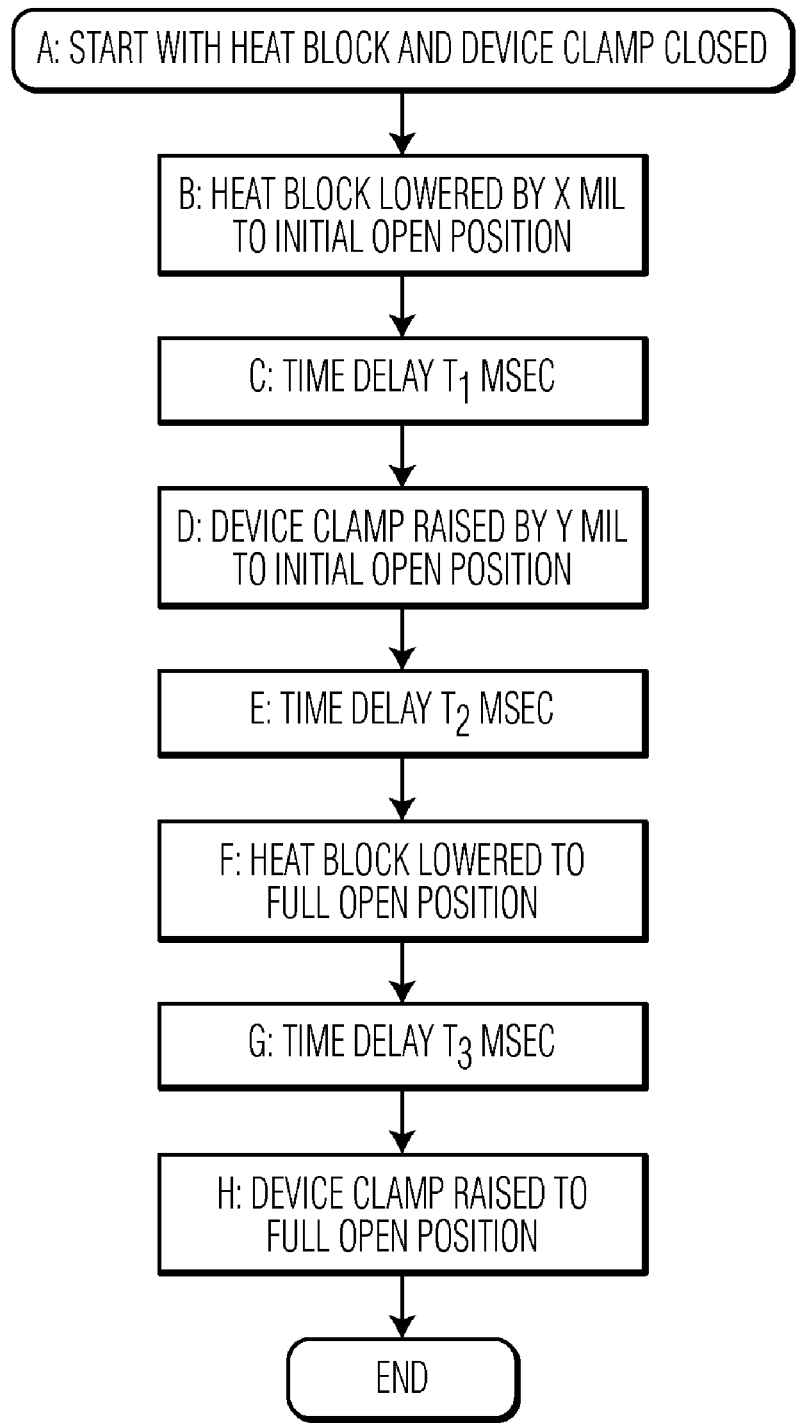
Figure 12:
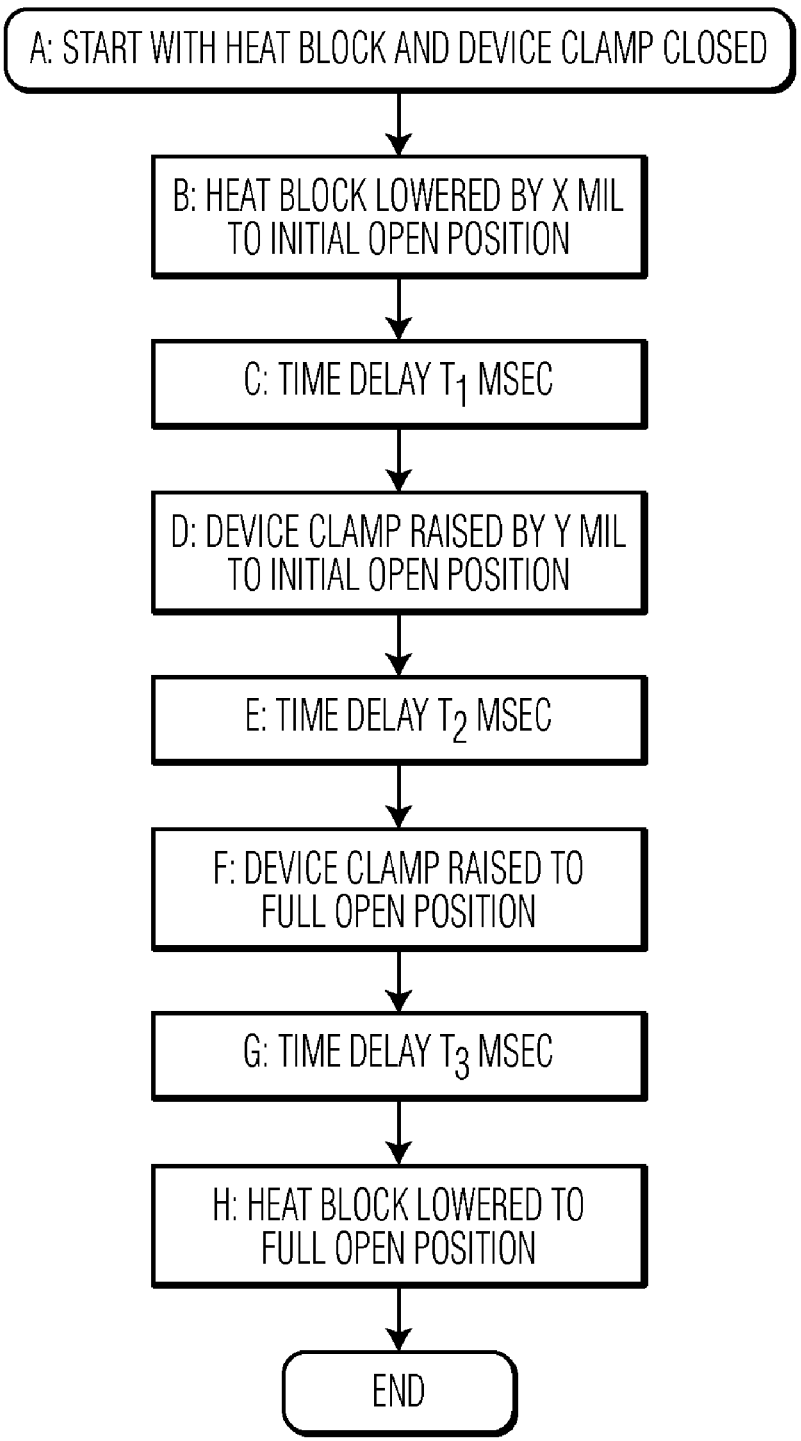
Figure 14:
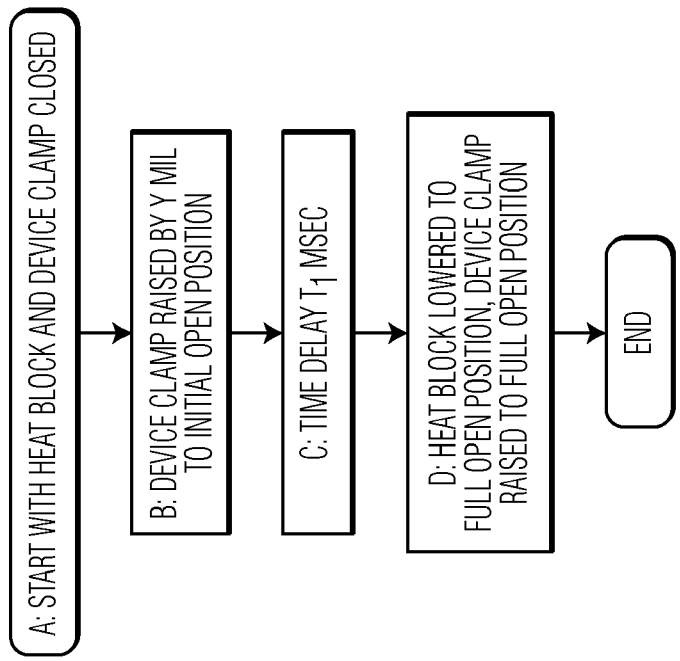
Figure 15:
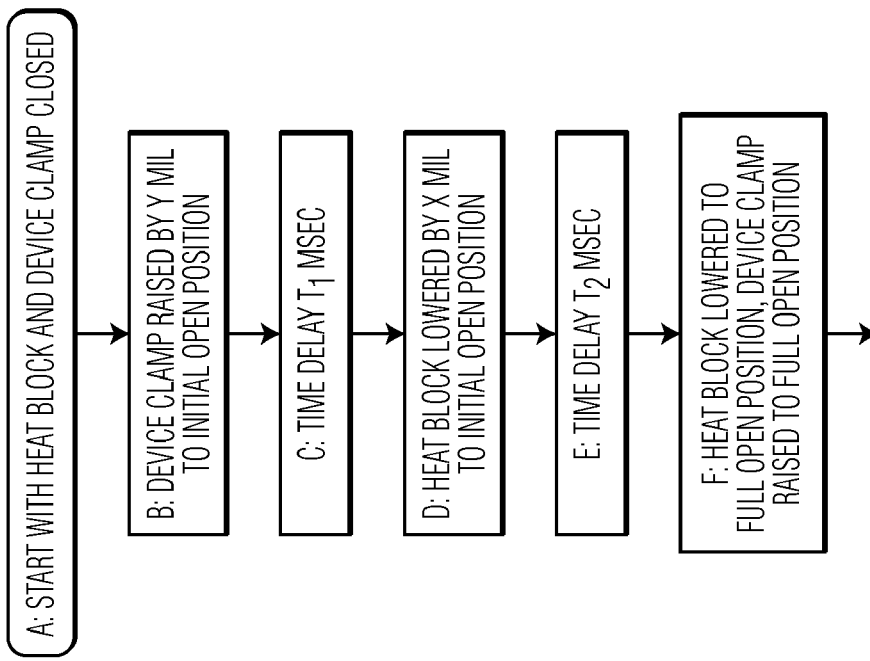
Figure 16:
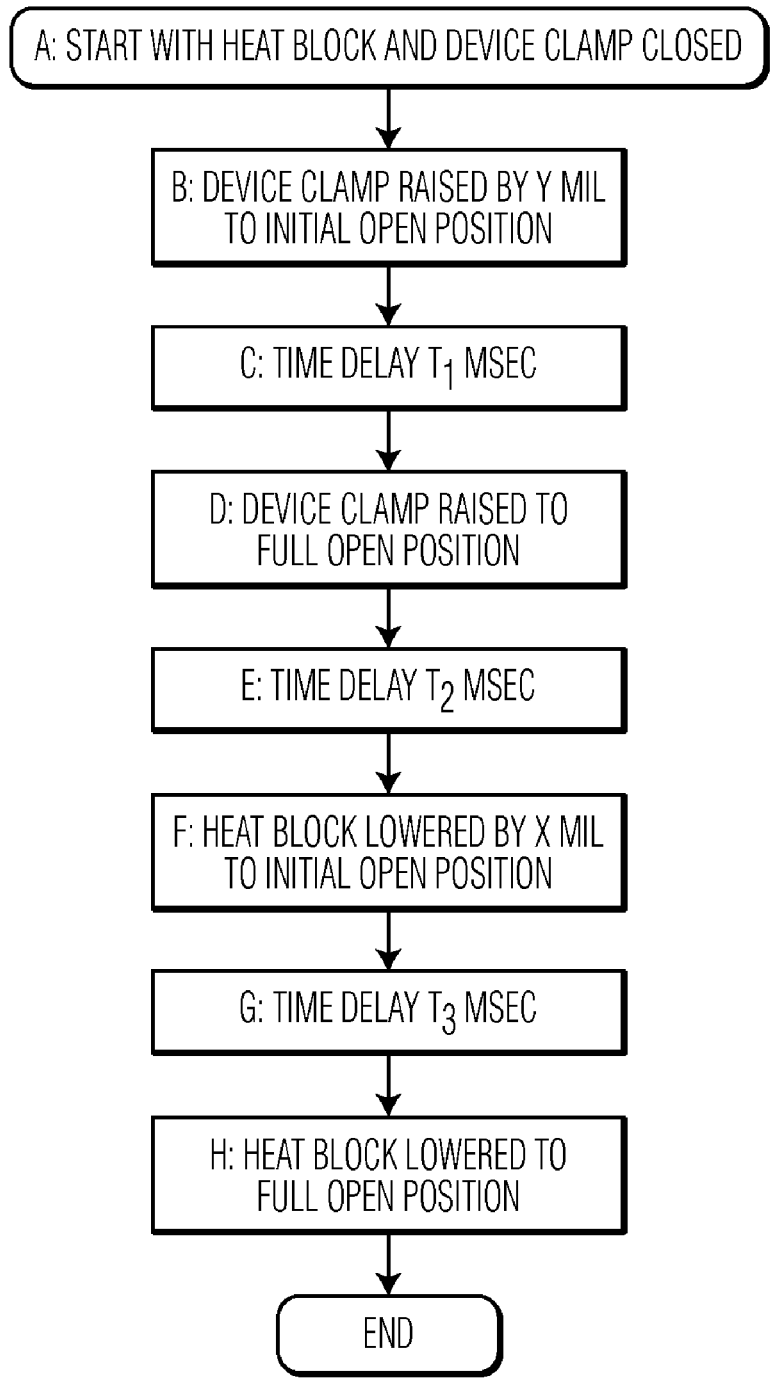
Figure 17:
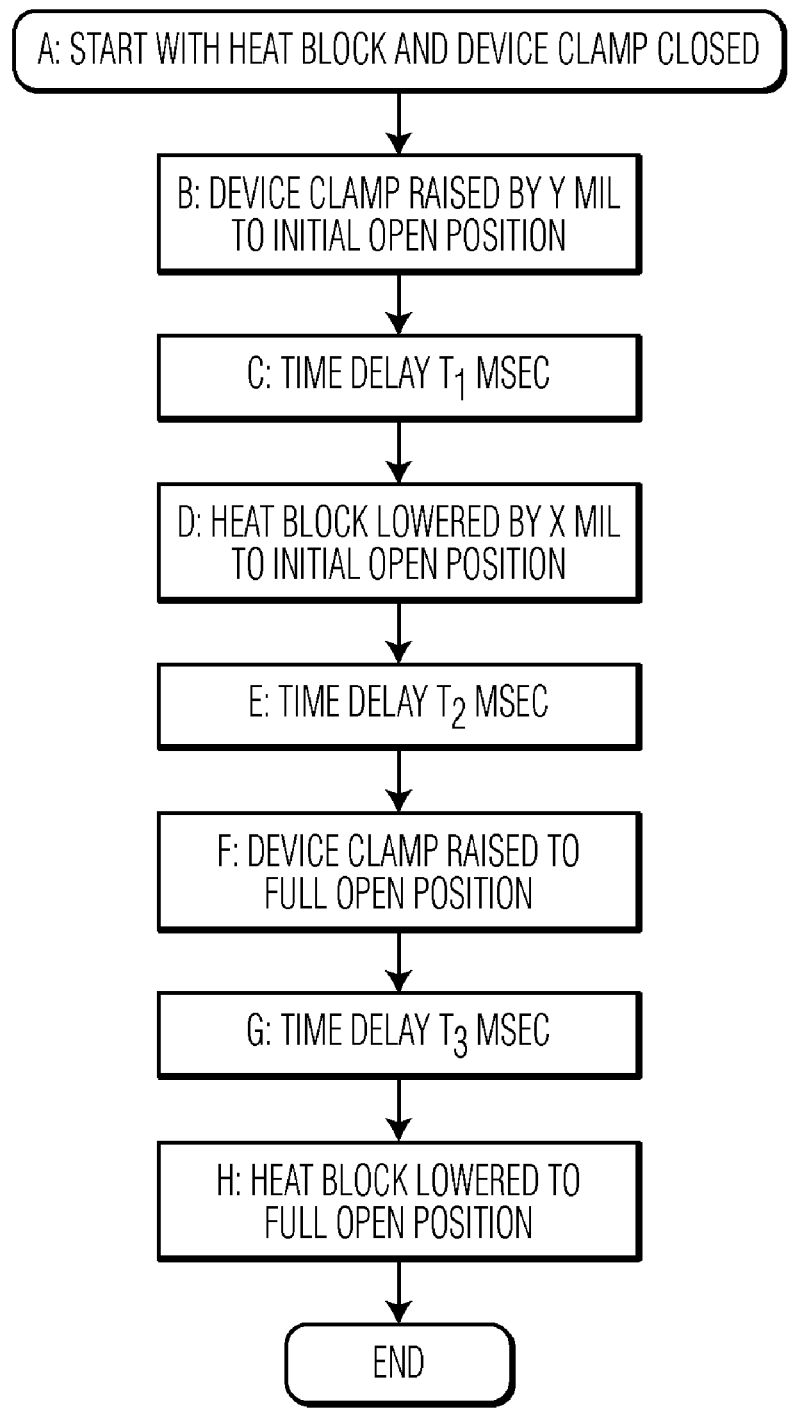
Figure 18:
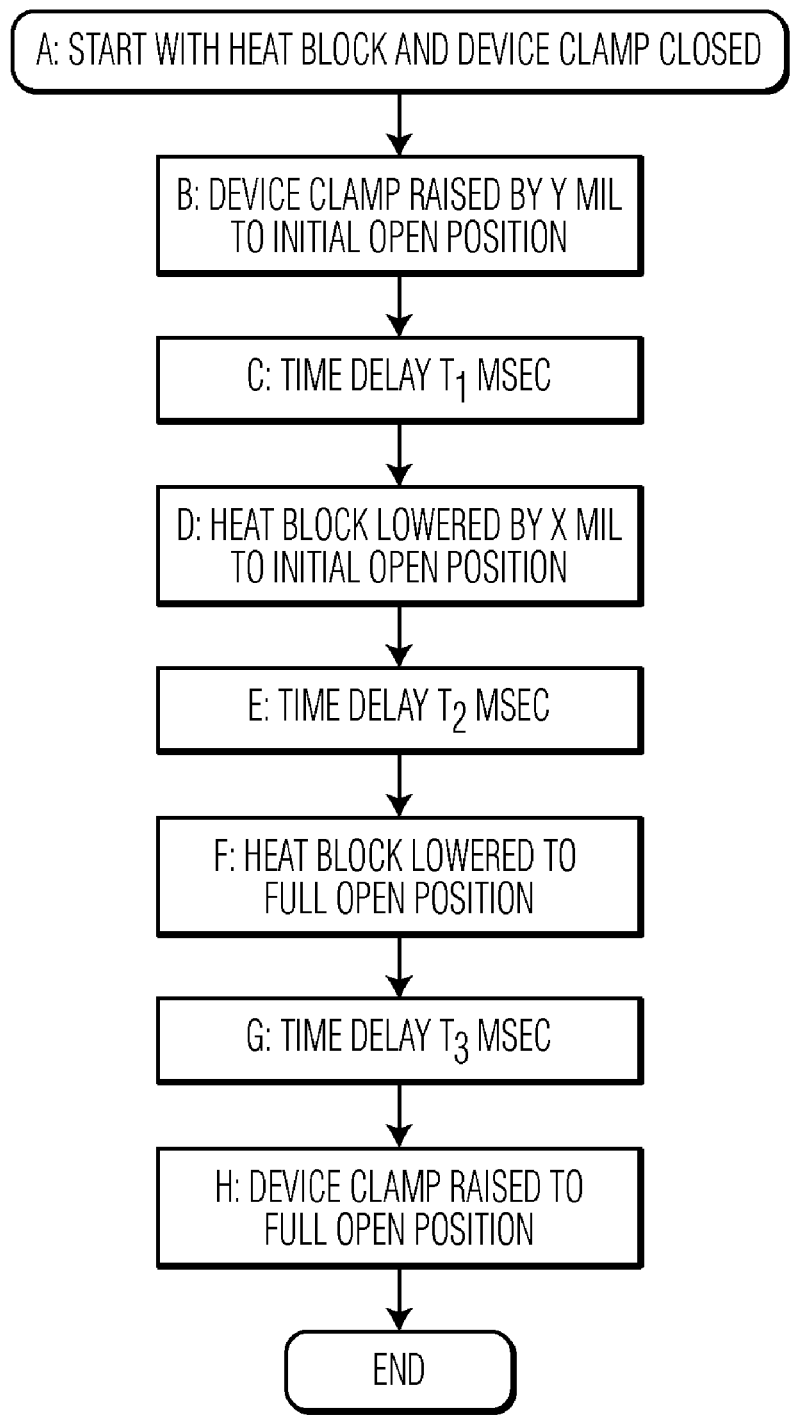
Figure 19:
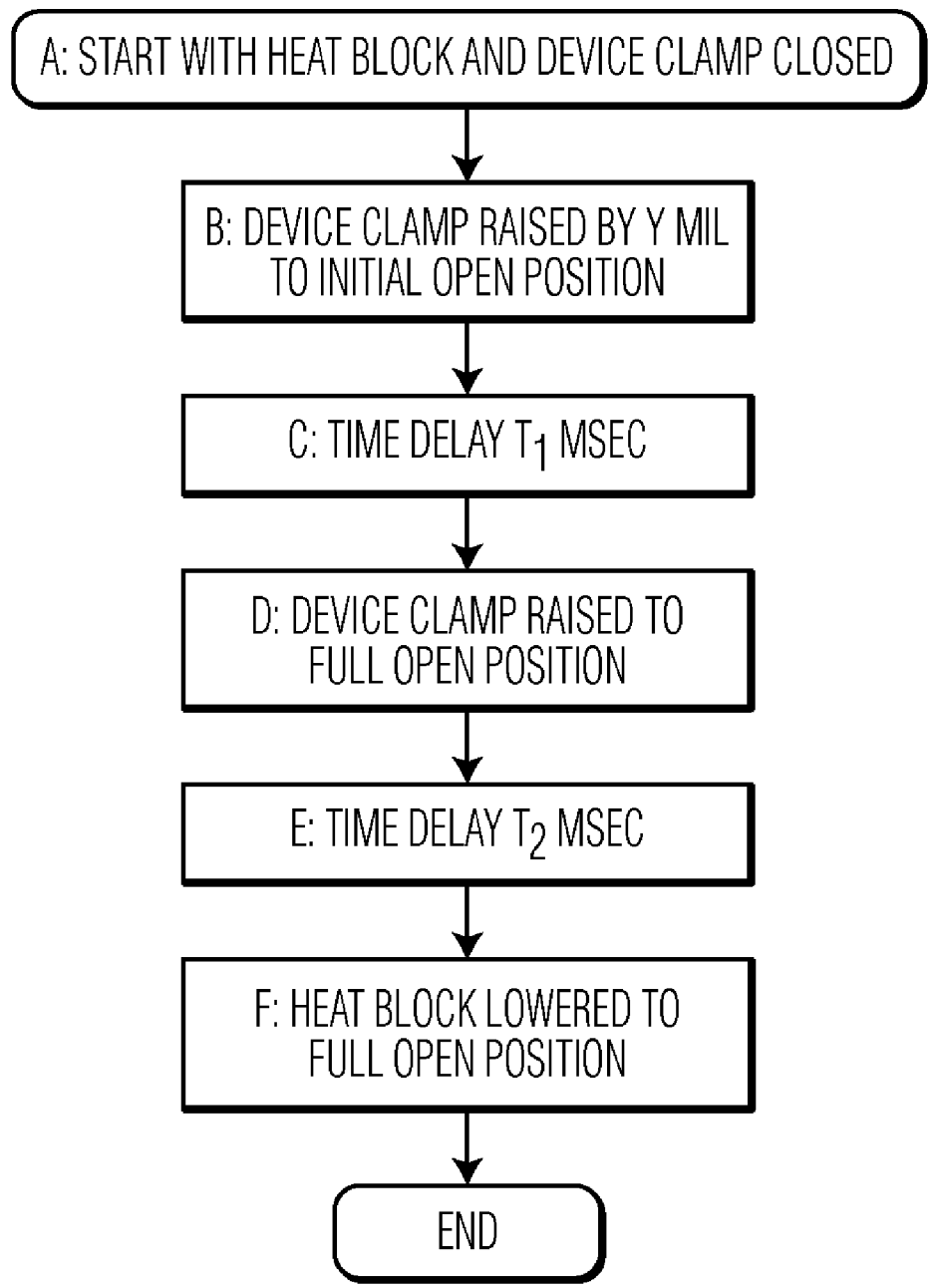

Each of FIGS. 6-19 varies somewhat from FIG. 5. In FIGS. 6 and 7, the elements are moved to their full open positions separately in steps D and E (not concurrently) (of course, their may be a time delay between steps D and E). In FIG. 8, the elements are moved to their initial open positions separately in steps B and D, and then moved to their full open positions concurrently in step F. In FIG. 9, the heat block is moved to its initial open position at step B (the device clamp has no initial open position in this example), and then both elements are moved to their full open position concurrently at step D. At FIG. 10, the heat block is lowered to its initial open position at step B, then to its full open position at step D; then the device clamp is raised to its initial open position at step F, then to its full open position at step H. At FIG. 11, the heat block is lowered to its initial open position at step B; the device clamp is raised to its initial open position at step D; then the heat block is lowered to its full open position at step F; then the device clamp is raised to its full open position at step H. At FIG. 12, the heat block is lowered to its initial open position at step B; the device clamp is raised to its initial open position at step D; then the device clamp is raised to its full open position at step F; then the heat block is lowered to its full open position at step H. At FIG. 13, the heat block is lowered to its initial open position at step B, then to its full open position at step D; then the device clamp is raised to its full open position at step F (the device clamp has no initial open position in this example). At FIG. 14, the device clamp is raised to its initial open position at step B; then the heat block is lowered to its initial open position at step D; and then both elements are moved to their full open position concurrently at step F. At FIG. 15, the device clamp is raised to its initial open position at step B; then both elements are moved to their full open position concurrently at step D (there is no initial open position for the heat block in this example). At FIG. 16, the device clamp is raised to its initial open position at step B; then the device clamp is raised to its full open position at step D; then the heat block is lowered to its initial open position at step F; and then the heat block is lowered to its full open position at step H. At FIG. 17, the device clamp is raised to its initial open position at step B; then the heat block is lowered to its initial open position at step D; then the device clamp is raised to its full open position at step F; and then the heat block is lowered to its full open position at step H. At FIG. 18, the device clamp is raised to its initial open position at step B; then the heat block is lowered to its initial open position at step D; then the heat block is lowered to its full open position at step F; and then the device clamp is raised to its full open position at step H. At FIG. 19, the device clamp is raised to its initial open position at step B; then the device clamp is raised to its full open position at step D; then the heat block is lowered to its full open position at step F (there is no initial open position for the heat block in this example).

Thus, FIGS. 5-19 illustrate a non-exhaustive exemplary list of techniques within the scope of the present invention. Of course, other techniques are also contemplated.

Although the clamping elements described herein are a device clamp (also known as a clamp insert or window clamp) and a heat block, the invention is not limited thereto. Other clamping elements are contemplated. For example, a different element (e.g., a clamp finger arrangement instead of a window clamp) may be used to secure the workpiece from above. Likewise, in certain applications an element other than a heat block could be used to support the workpiece from below.

Although the present invention is primarily described using only two positions for each clamping element (i.e., an initial open position and a full open position) it is not limited thereto. For example, the device clamp (or the heat block) may have an initial open position, an intermediary position and a full open position (i.e., 3 positions with associated time delays). Of course, additional positions (e.g., 4 positions, 5 positions, etc.) are contemplated.

Certain exemplary embodiments of the present invention include a time delay between steps. Of course, such a time delay could be zero. If no time delay is illustrated or described, it is clear that a time delay could be provided between such steps. Further, even if certain of the steps begin concurrently (e.g., the heat block and device clamp start to move toward their respective initial open positions at the same time) they may reach their respective positions (in this example, their initial open positions) at different times, and may have different time delays before moving on to a subsequent position (e.g., their full open positions).

Non-limiting examples of predetermined time delays between (1) a clamping element (e.g., a device clamp, a heat block, etc.) reaching its initial open position, and (2) a clamping element leaving its initial open position to move toward its full open position are: 0-10,000 milliseconds; 100-5,000 milliseconds; 300-1,000 milliseconds; and 500-800 milliseconds. Non-limiting examples of a vertical distance moved by a clamping element from (1) its closed position (i.e., a full closed position used during wire bonding, and (2) its initial open position: 0-100 mils; 3-50 mils; 5-20 mils; and 10-15 mils.

Certain aspects of the present invention have been described as a series of discrete steps occurring in succession, independent of one another. Of course, the steps could overlap if desired. The order of the steps is only intended to indicate when a certain action commences (e.g., when the device clamp or heat block starts to move to its initial open position or full open position).

Although the present invention has been described primarily with respect to multi-step opening sequences for clamping elements (e.g., a device clamp, a heat block, etc.), the invention also may applied to multi-step closing sequences for clamping a workpiece prior to performing a wire bonding operation.

The present invention has applicability to various wire bonding techniques including, for example, ball bonding (using a capillary bonding tool to ultrasonically form wire bonds), wedge bonding (using a wedge tool to ultrasonically form wire bonds), and ribbon bonding (using a ribbon tool to ultrasonically form ribbon bonds).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a wire bonding machine, the method comprising the steps of:
   (1) providing a workpiece secured in a bonding position by a device clamp of a wire bonding machine, the device clamp being distinct from a bonding tool of the wire bonding machine;

(2) raising the device clamp to a first height above the workpiece, the device clamp stopping at the first height and remaining at the first height for a first predetermined period of time; and (3) raising the device clamp to a second height above the workpiece after step (2), the second height being further away from the workpiece than the first height.

2. The method of claim 1 wherein the workpiece provided in step (1) is supported by a heat block of the wire bonding machine in the bonding position, the method further comprising the steps of: (4) lowering the heat block to a first position below the workpiece concurrent with step (2), the heat block remaining at the first position for a second predetermined period of time; and (5) lowering the heat block to a second position below the workpiece concurrent with step (3), the second position being farther away from the workpiece than the first position.

3. The method of claim 1 wherein the workpiece provided in step (1) is supported by a heat block of the wire bonding machine in the bonding position, the method further comprising the steps of: (4) lowering the heat block to a first position below the workpiece concurrent with step (2), the heat block remaining at the first position for a second predetermined period of time; and (5) lowering the heat block to a second position below the workpiece before step (3), the second position being farther away from the workpiece than the first position.

4. The method of claim 1 wherein the workpiece provided in step (1) is supported by a heat block of the wire bonding machine in the bonding position, the method further comprising the steps of: (4) lowering the heat block to a first position below the workpiece concurrent with step (2), the heat block remaining at the first position for a second predetermined period of time; and (5) lowering the heat block to a second position below the workpiece after step (3), the second position being farther away from the workpiece than the first position.

5. The method of claim 1 wherein the workpiece provided in step (1) is supported by a heat block of the wire bonding machine in the bonding position, the method further comprising the steps of: (4) lowering the heat block to a first position below the workpiece before step (2), the heat block remaining at the first position for a second predetermined period of time; and (5) lowering the heat block to a second position below the workpiece after step (2) but concurrent with step (3), the second position being farther away from the workpiece than the first position.

6. The method of claim 1 wherein the workpiece provided in step (1) is supported by a heat block of the wire bonding machine in the bonding position, the method further comprising the steps of: (4) lowering the heat block to a first position below the workpiece before step (2), the heat block remaining at the first position for a second predetermined period of time; and (5) lowering the heat block to a second position below the workpiece after step (4) but before step (2), the second position being farther away from the workpiece than the first position.

7. The method of claim 1 wherein the workpiece provided in step (1) is supported by a heat block of the wire bonding machine in the bonding position, the method further comprising the steps of: (4) lowering the heat block to a first position below the workpiece before step (2), the heat block remaining at the first position for a second predetermined period of time; and (5) lowering the heat block to a second position below the workpiece after step (2) and before step (3), the second position being farther away from the workpiece than the first position.

8. The method of claim 1 wherein the workpiece provided in step (1) is supported by a heat block of the wire bonding machine in the bonding position, the method further comprising the steps of: (4) lowering the heat block to a first position below the workpiece before step (2), the heat block remaining at the first position for a second predetermined period of time; and (5) lowering the heat block to a second position below the workpiece after step (4), after step (2), and after step (3), the second position being farther away from the workpiece than the first position.

9. The method of claim 1 wherein the workpiece provided in step (1) is supported by a heat block of the wire bonding machine in the bonding position, the method further comprising the steps of: (4) lowering the heat block to a first position below the workpiece after step (2), the heat block remaining at the first position for a second predetermined period of time; and (5) lowering the heat block to a second position below the workpiece concurrent with step (3), the second position being farther away from the workpiece than the first position.

10. The method of claim 1 wherein the workpiece provided in step (1) is supported by a heat block of the wire bonding machine in the bonding position, the method further comprising the step of: (4) lowering the heat block to a position below the workpiece concurrent with step (3).

11. The method of claim 1 wherein the workpiece provided in step (1) is supported by a heat block of the wire bonding machine in the bonding position, the method further comprising the steps of: (4) lowering the heat block to a first position below the workpiece after step (2), and after step (3), the heat block remaining at the first position for a second predetermined period of time; and (5) lowering the heat block to a second position below the workpiece after step (4), the second position being farther away from the workpiece than the first position.

12. The method of claim 1 wherein the workpiece provided in step (1) is supported by a heat block of the wire bonding machine in the bonding position, the method further comprising the steps of: (4) lowering the heat block to a first position below the workpiece after step (2), the heat block remaining at the first position for a predetermined period of time; and (5) lowering the heat block to a second position below the workpiece after step (3), the second position being farther away from the workpiece than the first position.

13. The method of claim 1 wherein the workpiece provided in step (1) is supported by a heat block of the wire bonding machine in the bonding position, the method further comprising the steps of: (4) lowering the heat block to a first position below the workpiece after step (2), the heat block remaining at the first position for a second predetermined period of time; and (5) lowering the heat block to a second position below the workpiece before step (3), the second position being farther away from the workpiece than the first position.

14. The method of claim 1 wherein the workpiece provided in step (1) is supported by a heat block of the wire bonding machine in the bonding position, the method further comprising the step of: (4) lowering the heat block to a position below the workpiece after step (3).

15. A method of operating a wire bonding machine, the method comprising the steps of:
(1) providing a workpiece supported in a bonding position by a heat block of a wire bonding machine;
(2) lowering the heat block to a first position below the workpiece, the heat block stopping at the first position and remaining at the first position for a first predetermined period of time; and (3) lowering the heat block to a second position below the workpiece after step (2), the second position being further away from the workpiece than the first position.

16. The method of claim 15 wherein the workpiece provided in step (1) is secured to the heat block in the bonding position by a device clamp of the wire bonding machine, the method further comprising the steps of: (4) raising the device clamp to a first height above the workpiece concurrent with step (2), the device clamp remaining at the first height for a second predetermined period of time; and (5) raising the device clamp to a second height above the workpiece concurrent with step (3), the second height being further away from the workpiece than the first height.

17. The method of claim 15 wherein the workpiece provided in step (1) is secured to the heat block in the bonding position by a device clamp of the wire bonding machine, the method further comprising the steps of: (4) raising the device clamp to a first height above the workpiece concurrent with step (2), the device clamp remaining at the first height for a second predetermined period of time; and (5) raising the device clamp to a second height above the workpiece after step (3), the second height being further away from the workpiece than the first height.

18. The method of claim 15 wherein the workpiece provided in step (1) is secured to the heat block in the bonding position by a device clamp of the wire bonding machine, the method further comprising the steps of: (4) raising the device clamp to a first height above the workpiece concurrent with step (2), the device clamp remaining at the first height for a second predetermined period of time; and (5) raising the device clamp to a second height above the workpiece before step (3), the second height being further away from the workpiece than the first height.

19. The method of claim 15 wherein the workpiece provided in step (1) is secured to the heat block in the bonding position by a device clamp of the wire bonding machine, the method further comprising the steps of: (4) raising the device clamp to a first height above the workpiece after step (2) but before step (3), the device clamp remaining at the first height for a second predetermined period of time; and (5) raising the device clamp to a second height above the workpiece concurrent with step (3), the second height being further away from the workpiece than the first height.

20. The method of claim 15 wherein the workpiece provided in step (1) is secured to the heat block in the bonding position by a device clamp of the wire bonding machine, the method further comprising the step of: (4) raising the device clamp to a height above the workpiece concurrent with step (3).

21. The method of claim 15 wherein the workpiece provided in step (1) is secured to the heat block in the bonding position by a device clamp of the wire bonding machine, the method further comprising the steps of: (4) raising the device clamp to a first height above the workpiece after step (3), the device clamp remaining at the first height for a second predetermined period of time; and (5) raising the device clamp to a second height above the workpiece after step (4), the second height being further away from the workpiece than the first height.

22. The method of claim 15 wherein the workpiece provided in step (1) is secured to the heat block in the bonding position by a device clamp of the wire bonding machine, the method further comprising the steps of: (4) raising the device clamp to a first height above the workpiece after step (2) but before step (3), the device clamp remaining at the first height for a second predetermined period of time; and (5) raising the device clamp to a second height above the workpiece after step (4), the second height being further away from the workpiece than the first height.

23. The method of claim 15 wherein the workpiece provided in step (1) is secured to the heat block in the bonding position by a device clamp of the wire bonding machine, the method further comprising the steps of: (4) raising the device clamp to a first height above the workpiece after step (2) but before step (3), the device clamp remaining at the first height for a second predetermined period of time; and (5) raising the device clamp to a second height above the workpiece after step (4) but before step (3), the second height being further away from the workpiece than the first height.

24. The method of claim 15 wherein the workpiece provided in step (1) is secured to the heat block in the bonding position by a device clamp of the wire bonding machine, the method further comprising the step of: (4) raising the device clamp to a height above the workpiece after step (2) and (3).

25. The method of claim 15 wherein the workpiece provided in step (1) is secured to the heat block in the bonding position by a device clamp of the wire bonding machine, the method further comprising the steps of: (4) raising the device clamp to a first height above the workpiece before step (2), the device clamp remaining at the first height for a second predetermined period of time; and (5) raising the device clamp to a second height above the workpiece concurrent with step (3), the second height being further away from the workpiece than the first height.

26. The method of claim 15 wherein the workpiece provided in step (1) is secured to the heat block in the bonding position by a device clamp of the wire bonding machine, the method further comprising the steps of: (4) raising the device clamp to a first height above the workpiece before step (2), the device clamp remaining at the first height for a second predetermined period of time; and (5) raising the device clamp to a second height above the workpiece after step (4) but before step (2), the second height being further away from the workpiece than the first height.

27. The method of claim 15 wherein the workpiece provided in step (1) is secured to the heat block in the bonding position by a device clamp of the wire bonding machine, the method further comprising the steps of: (4) raising the device clamp to a first height above the workpiece before step (2), the device clamp remaining at the first height for a second predetermined period of time; and (5) raising the device clamp to a second height above the workpiece after steps (4) and (2) but before step (3), the second height being further away from the workpiece than the first height.

28. The method of claim 15 wherein the workpiece provided in step (1) is secured to the heat block in the bonding position by a device clamp of the wire bonding machine, the method further comprising the steps of: (4) raising the device clamp to a first height above the workpiece before step (2), the device clamp remaining at the first height for a second predetermined period of time; and (5) raising the device clamp to a second height above the workpiece after steps (2) and (3), the second height being further away from the workpiece than the first height.

* * * * *